(12) United States Patent
Jun et al.

(10) Patent No.: US 8,871,541 B2
(45) Date of Patent: Oct. 28, 2014

(54) TOUCH PANEL OF AN ORGANIC LIGHT EMITTING DIODE DISPLAY AND MANUFACTURING METHOD THEREOF

(75) Inventors: Woo-Sik Jun, Yongin (KR); Won-Kyu Kwak, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 933 days.

(21) Appl. No.: 12/949,560

(22) Filed: Nov. 18, 2010

(65) Prior Publication Data
US 2011/0193799 A1    Aug. 11, 2011

(30) Foreign Application Priority Data

Feb. 11, 2010 (KR) .................. 10-2010-0012884

(51) Int. Cl.
*H01L 21/00* (2006.01)
*G06F 3/041* (2006.01)
*H01L 27/32* (2006.01)
*G06F 3/044* (2006.01)

(52) U.S. Cl.
CPC .... *H01L 27/323* (2013.01); *G06F 2203/04103* (2013.01); *G06F 2203/04111* (2013.01); *G06F 3/0412* (2013.01); *G06F 3/044* (2013.01)
USPC ..................... 438/34; 257/E51.019

(58) Field of Classification Search
CPC .......... G06F 3/044; G06F 2203/04103; G06F 3/03547; G06F 2203/04808; G06F 3/0488; G02F 1/13338; H01L 27/12; H01L 27/323
USPC ..................... 438/34; 257/E51.019
See application file for complete search history.

(56) References Cited

U.S. PATENT DOCUMENTS

| 2004/0124765 | A1  | 7/2004  | Iwase |
| 2005/0230757 | A1* | 10/2005 | Nagasawa et al. ............ 257/355 |
| 2007/0058099 | A1* | 3/2007  | Eguchi ............................ 349/43 |
| 2007/0247443 | A1  | 10/2007 | Philipp |
| 2008/0136787 | A1  | 6/2008  | Yeh et al. |
| 2008/0309627 | A1  | 12/2008 | Hotelling et al. |
| 2008/0309633 | A1  | 12/2008 | Hotelling et al. |
| 2008/0309635 | A1  | 12/2008 | Matsuo |

(Continued)

FOREIGN PATENT DOCUMENTS

| JP | 2008-310551 | 12/2008 |
| KR | 10-2007-0050209 A | 5/2007 |

(Continued)

*Primary Examiner* — Duy T Nguyen
(74) *Attorney, Agent, or Firm* — Robert E. Bushnell, Esq.

(57) ABSTRACT

An organic light emitting diode display includes: an organic light emitting display panel including a first substrate including an organic light emitting element and a second substrate combined with the first substrate; a touch substrate combined with the organic light emitting display panel; a first electrode pattern having a plurality of pads, formed on the touch substrate, and connected by an access unit in a first direction; a second electrode pattern having a plurality of pads; a wire electrically connected to one of the first electrode pattern and the second electrode pattern; an insulation layer formed on the first and second electrode patterns and including a contact hole; and a connection electrode disposed in the contact hole and electrically connecting pads of the second electrode pattern in a second direction crossing the first direction, wherein the first electrode pattern, the second electrode pattern, and the wire are formed simultaneously on the same plane.

8 Claims, 10 Drawing Sheets

(56) References Cited

U.S. PATENT DOCUMENTS

2009/0078933 A1* 3/2009 Koo et al. .................. 257/40
2009/0322704 A1* 12/2009 Anno ........................ 345/174
2010/0110040 A1   5/2010 Kim et al.

FOREIGN PATENT DOCUMENTS

| KR | 10-0865398 A    | 10/2008 |
| KR | 10-2008-0110477 | 12/2008 |
| KR | 10-2009-0121638 A | 11/2009 |

* cited by examiner (S101)

(S102)

TOUCH PANEL OF AN ORGANIC LIGHT EMITTING DIODE DISPLAY AND MANUFACTURING METHOD THEREOF

CLAIM OF PRIORITY

This application makes reference to, incorporates the same herein, and claims all benefits accruing under 35 U.S.C §119 from an application entitled ORGANIC LIGHT EMITTING DIODE DISPLAY AND MANUFACTURING METHOD THEREOF earlier filed in the Korean Intellectual Property Office on 11 Feb. 2010 and there duly assigned Serial No. 10-2010-0012884.

BACKGROUND OF THE INVENTION

1. Field of the Invention

The present invention relates generally to an organic light emitting diode (OLED) display and a manufacturing method thereof. More particularly, the described technology relates generally to an organic light emitting diode (OLED) display having a touch screen function, and a manufacturing method thereof.

2. Description of the Related Art

A touch screen function has been recently introduced to the organic light emitting diode (OLED) display, and skills for realizing various types of user interfaces (UI) have been highlighted. In order to realize the touch screen function, a touch panel for recognizing input information caused by an input means such as a pen or a user's finger is attached to the organic light emitting display panel.

A capacitive touch screen panel detects an input position by measuring a change of capacitance between electrodes of touched positions on the panel. Low contact resistance and sheet resistance are required in order to acquire excellent touch performance from the capacitive touch screen panel. For this purpose, it is possible to reduce the sheet resistance by increasing thickness of the electrode, but in this case, transmittance of light is deteriorated because of the thickened electrode.

The above information disclosed in this Background section is only for enhancement of understanding of the background of the described technology and therefore it may contain information that does not form the prior art that is already known in this country to a person of ordinary skill in the art.

SUMMARY OF THE INVENTION

The described technology has been developed in an effort to provide an organic light emitting diode (OLED) display for providing improved touch performance while installing a touch screen through a simple process, and a manufacturing method thereof.

An exemplary embodiment provides an organic light emitting diode display including: an organic light emitting display panel including a first substrate including an organic light emitting element and a second substrate combined with the first substrate; a touch substrate combined with the organic light emitting display panel; a first electrode pattern having a plurality of pads, formed on the touch substrate, and connected in a first direction; a second electrode pattern having a plurality of pads, and connected in a second direction crossing the first direction; a wire electrically connected to one of the first electrode pattern and the second electrode pattern; an insulation layer formed on the first electrode and the second electrode pattern and including a contact hole; and a connection electrode inserted into the contact hole and electrically connecting pads of the first electrode pattern or pads of the second electrode pattern, wherein the first electrode pattern, the second electrode pattern, and the wire are formed on the same plane.

The first electrode pattern, the second electrode pattern, and the wire are made of the same material, and the first electrode pattern, the second electrode pattern, and the wire include silver (Ag).

The first electrode pattern, the second electrode pattern, and the wire include a transparent oxide layer and a metallic layer, and the transparent oxide layer is made of indium tin oxide (ITO) and the metallic layer is made of silver (Ag).

The first electrode pattern or the second electrode pattern includes a first transparent oxide layer, a second transparent oxide layer arranged to face the first transparent oxide layer, and a first metallic layer disposed between the first transparent oxide layer and the second transparent oxide layer, and the wire includes a third transparent oxide layer, a fourth transparent oxide layer arranged to face the third transparent oxide layer, and a second metallic layer disposed between the third transparent oxide layer and the fourth transparent oxide layer.

Each of the transparent oxide layers are made of indium tin oxide (ITO), the metallic layers are made of silver (Ag), and at a crossing point where the first electrode pattern crosses the second electrode pattern, pads of the first electrode pattern are electrically connected by an access unit that is formed on the same plane, pads of the second electrode pattern are separately disposed, and the connection electrode that is insulated from the access unit is provided on the access unit to electrically connect the pads of the second electrode pattern.

A partial insulation layer is formed between the access unit and the connection electrode.

Another embodiment provides a method for manufacturing an organic light emitting diode display including an organic light emitting display panel and a touch panel attached to the organic light emitting display panel, including: forming an electrode layer on a touch substrate of the touch panel; forming an electrode pattern having a plurality of pads and a wire by etching the electrode layer; forming an insulation layer on the etched electrode layer; forming a contact hole by etching the insulation layer; forming a metallic layer on the insulation layer while filling the contact hole; and forming a connection electrode for electrically connecting the plurality of pads by etching the metallic layer.

In the forming of the electrode pattern and wire, the electrode pattern includes a first electrode pattern connected in a first direction and a second electrode pattern connected in a second direction crossing the first direction, and at a crossing point of the first electrode pattern and the second electrode pattern, pads of the first electrode pattern are connected to an access unit formed by the electrode layer, and pads of the second electrode pattern are separately formed.

The forming of the contact hole includes exposing ends of the separately disposed pads of the second electrode pattern through the contact hole, and the forming of the connection electrode includes electrically connecting the neighboring pads of the second electrode pattern by inserting both ends of the connection electrode into neighboring contact holes.

The electrode layer includes a metallic layer made of silver (Ag) and a transparent oxide layer made of indium tin oxide (ITO), and the electrode layer is configured with a structure in which an ITO layer, a Ag layer, and an ITO layer are sequentially disposed.

According to an organic light emitting diode (OLED) display and a manufacturing method thereof of exemplary embodiments, an organic light emitting diode (OLED) display having an excellent touch screen function with low sheet resistance can be manufactured by a simplified process.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
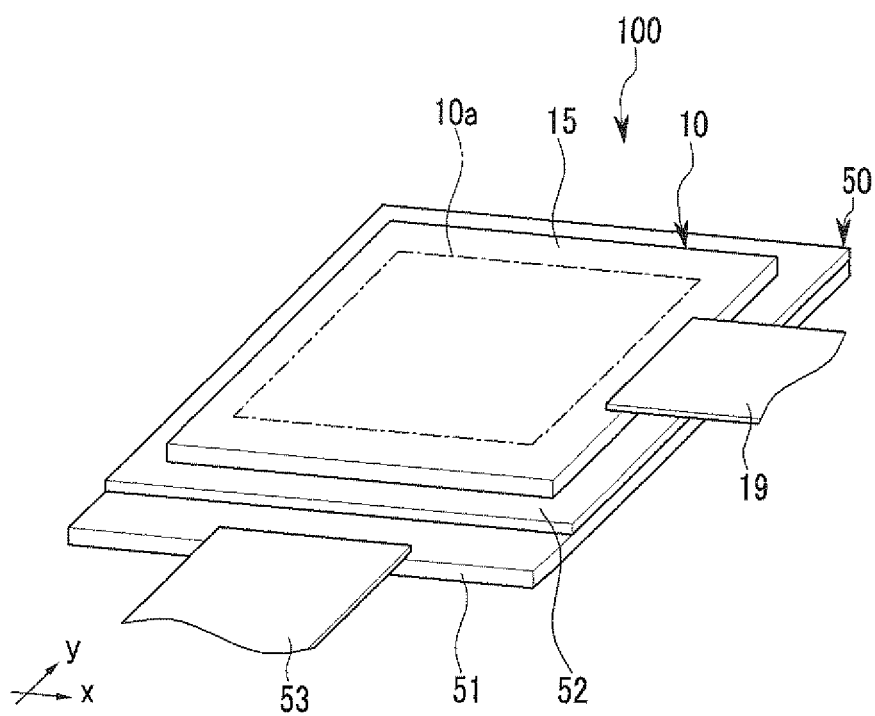
FIG. 1 is a perspective view of an organic light emitting diode (OLED) display according to a first exemplary embodiment.

In the following detailed description, only certain exemplary embodiments have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification.

Furthermore, as the size and thickness of the respective structural components shown in the drawings are arbitrarily illustrated for explanatory convenience, the present invention is not necessarily limited to as illustrated. In the drawings, the thickness of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
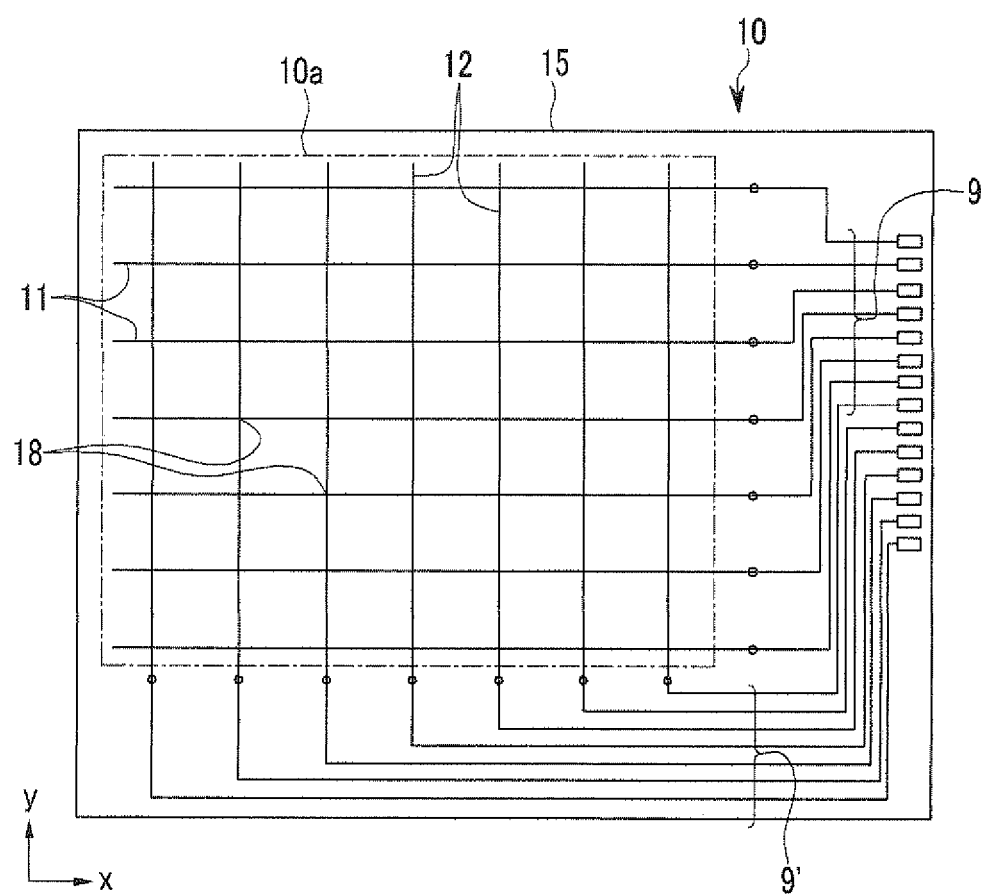
FIG. 2 is a schematic diagram of electrical connection of a plane structure of an organic light emitting diode (OLED) display according to the first exemplary embodiment.

FIG. 1 is a perspective view of an organic light emitting diode (OLED) display according to a first exemplary embodiment, and FIG. 2 is a schematic diagram of electrical connection of a plane structure of an organic light emitting diode (OLED) display according to the first exemplary embodiment.

Referring to FIG. 1 and FIG. 2, the organic light emitting diode (OLED) display 100 includes an organic light emitting display panel 50 including a plurality of pixels in a display area and displaying an image, and a touch screen panel 10 disposed at the front of the organic light emitting display panel 50 and functioning as an input device.

The touch screen panel 10 includes a controller and a driver (not shown). The controller calculates information on a position touched by the user by converting an electrical analog signal transmitted by the touch screen panel 10 into a digital signal through an A/D converter. The driver moves a pointer on the screen or processes a selected item according to a coordinate signal input by the controller in connection with an image controller (not shown) of the organic light emitting display panel 50.

The organic light emitting display panel 50 includes a first substrate 51 on which organic light emitting elements are formed, and a second substrate 52 attached to the first substrate 51. The first substrate 51 is wider than the second substrate 52 and is protruded, and the protruded part thereof is electrically connected to a first flexible printed circuit board (FPCB) 53. Pad electrodes (not shown) for transmitting electrical signals to a scan driver and a data driver are formed on the first flexible printed circuit board (FPCB) 53.

The touch screen panel 10 is capacitive type, and it includes a touch substrate 15 and a second flexible printed circuit board (FPCB) 19 connected to an end of the touch substrate 15. A driving circuit (not shown) for detecting the input position on the screen panel 10 accesses the second flexible printed circuit board (FPCB) 19. An input side for sensing a touch reaction is configured on the touch substrate 15 of the touch screen panel 10, and an input area 10a for receiving a signal according to the user's touch is set on the input side.

A plurality of first electrode patterns 11 (FIG. 2) in the first direction (x-axis direction) and a plurality of second electrode patterns 12 in the second direction (y-axis direction) crossing the first direction are formed in the input area 10a of the touch substrate 15. The first electrode patterns 11 and the second electrode patterns 12 are exemplarily described in the present exemplary embodiment to be orthogonal with stripe patterns, but the present invention is not restricted thereto, and it is sufficient for the first electrode pattern 11 and the second electrode pattern 12 to cross each other.

The first electrode patterns 11 and the second electrode patterns 12 are respectively connected to the flexible printed circuit board (FPCB) 19 through wires 9 and 9'. The wires 9 and 9' are disposed on the external side of the input area 10a of the touch substrate 15, and they are electrically connected to the first electrode patterns 11 and the second electrode patterns 12 to transmit signals.

In the above-configured touch screen panel 10, voltages are sequentially applied to the first electrode patterns 11 and the second electrode patterns 12, and when the charges are stored and a part is touched, the capacitance of the first electrode patterns 11 and the second electrode patterns 12 are changed and the position where the touch is generated can be known.

Figure 3:
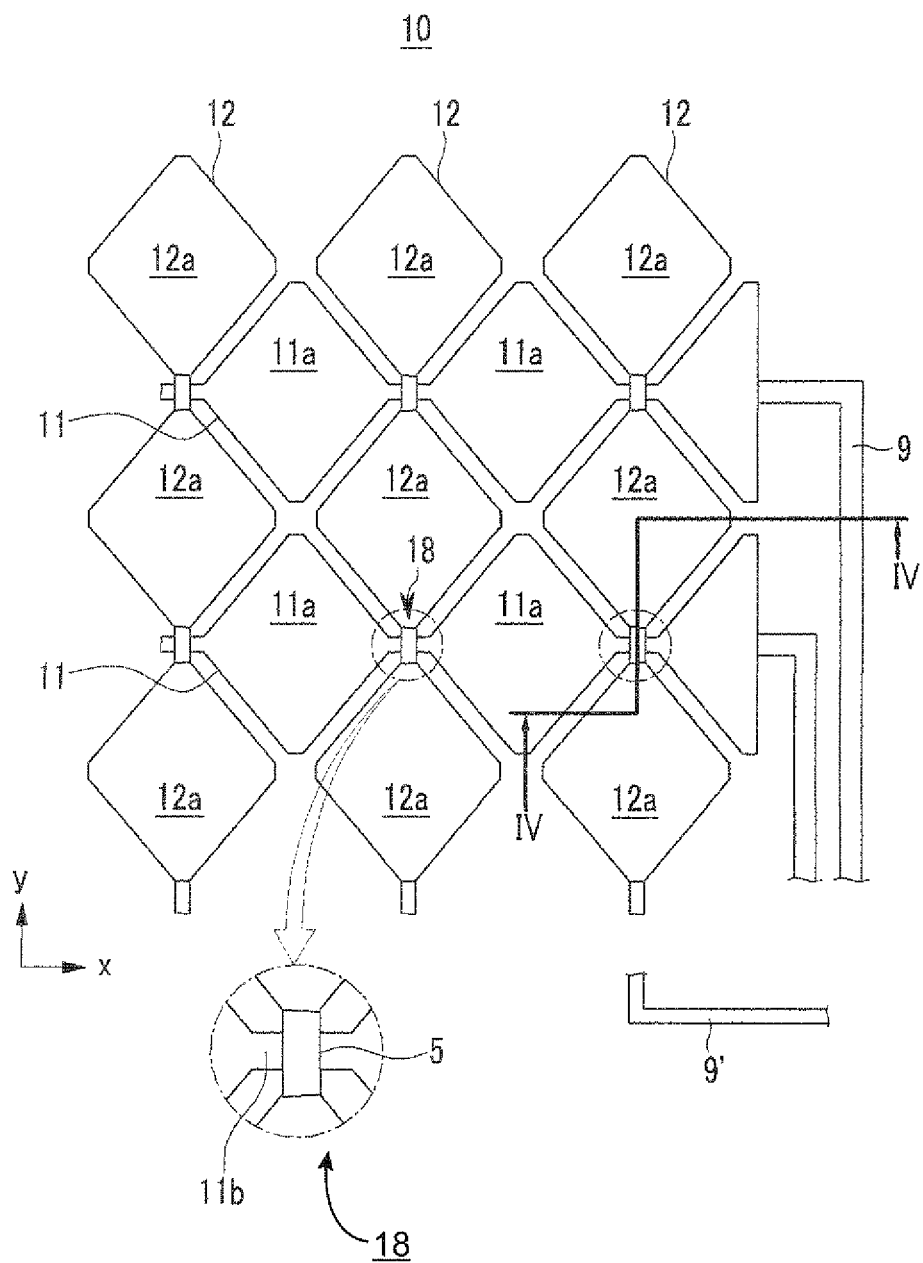
FIG. 3 is a partial top plan view of a touch screen panel according to the first exemplary embodiment.
Figure 4:
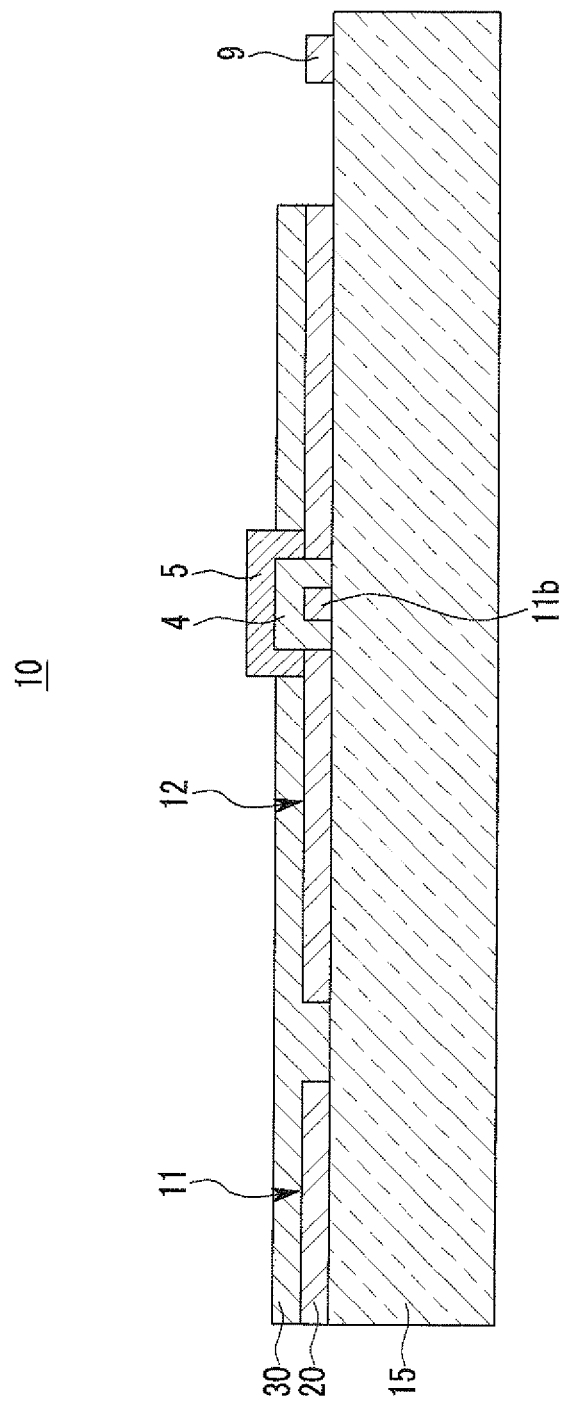
FIG. 4 is a cross-sectional view with respect to the IV-IV line of FIG. 3.

FIG. 3 is a partial top plan view of the touch screen panel according to the first exemplary embodiment, and FIG. 4 is a cross-sectional view with respect to the IV-IV line of FIG. 3.

Referring to FIG. 3 and FIG. 4, the first electrode patterns 11 include a plurality of pads 11a that are formed in the first direction (x-axis direction), and the second electrode patterns 12 include a plurality of pads 12a that are formed in the second direction (y-axis direction). In this instance, the pads 11a of the first electrode pattern 11 and the pads 12a of the second electrode pattern 12 are formed on the same plane, and crossing points 18 where the first electrode patterns 11 cross the second electrode patterns 12 are formed. At the crossing points 18, the pads 11a of the first electrode pattern 11 are connected in the first direction and are separated in the second direction, and the pads 12a of the second electrode patterns 12 are separated in the first direction and are connected in the second direction.

The first electrode pattern 11 is substantially formed in a rhombus shape with reference to the plane, and it includes an access unit 11b that substantially has the same width as the minimum width of the pad 11a and is formed at the crossing point 18. The second electrode pattern 12 is substantially formed in a rhombus shape with reference to the plane, and it is connected in the second direction by a connection electrode 5 to be described.

At the crossing point 18, the access unit 11b of the first electrode pattern 11 is covered by a partial insulation layer 4, and the connection electrode 5 for connecting the second electrode patterns 12 on the partial insulation layer 4 is formed. Accordingly, the first electrode patterns 11 are electrically connected in the first direction, and the second electrode patterns 12 are insulated from the first electrode patterns 11 and electrically connected in the second direction.

The plurality of wires 9 and 9' electrically connected to the first electrode pattern 11 and the second electrode pattern 12 are formed on the outside of the input area 10a, and accesses the second flexible printed circuit board (FPCB) 19.

The first electrode pattern 11, the second electrode pattern 12, and the wires 9 and 9' are formed on the same plane in the touch screen panel 10, and are made of the same material because the first electrode pattern 11, the second electrode pattern 12, and the wires 9 and 9' are formed by etching the same layer.

The first electrode pattern 11, the second electrode pattern 12, and the wires 9 and 9' can be formed by etching the electrode layer 20 of silver (Ag) so as to generate respective patterns. In this instance, the thickness of the electrode layer 20 can be less than 1000 Å.

An insulation layer 30 is formed on the electrode layer 20.

When the first and second electrode patterns 11 and 12 and the wires 9 and 9' are formed on the same plane according to the embodiment, the wires 9 and 9' can be formed when the first and second electrode patterns 11 and 12 are formed. Also, when the electrode patterns 11 and 12 are formed with the same metal material as the wires 9 and 9', sheet resistance of the electrode patterns 11 and 12 can be reduced.

Figure 5:
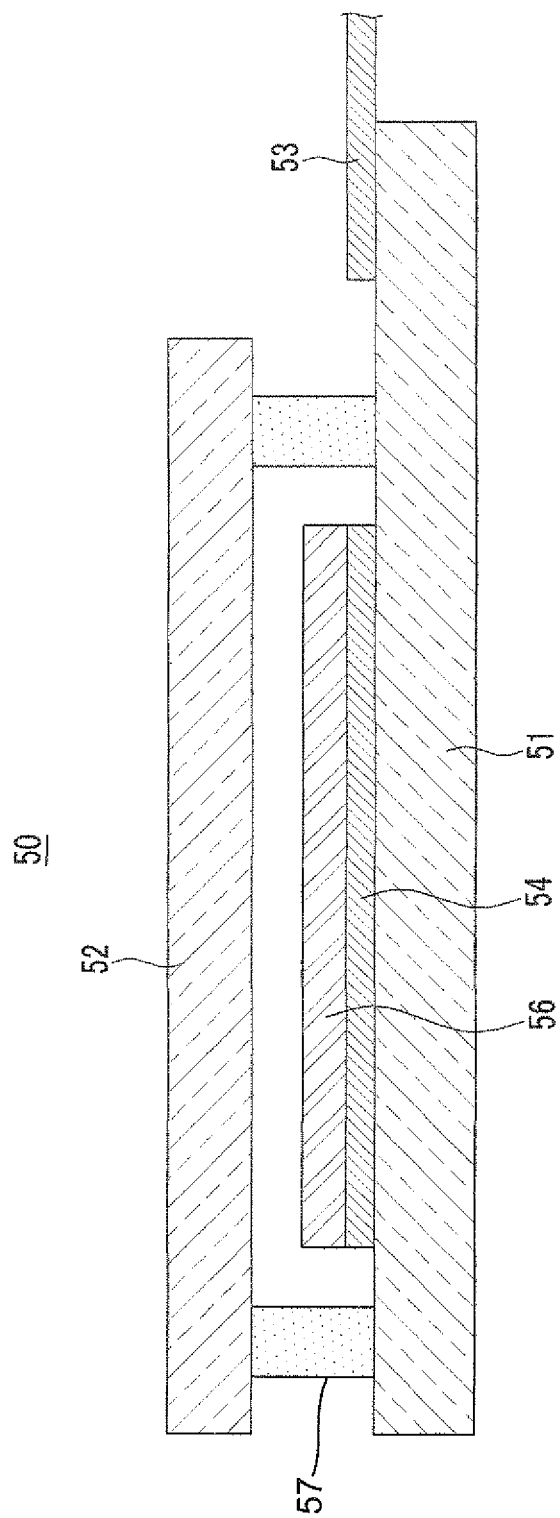
FIG. 5 is a cross-sectional view of an organic light emitting display panel according to the first exemplary embodiment.

FIG. 5 is a cross-sectional view of an organic light emitting display panel according to a first exemplary embodiment.

As shown in FIG. 5, the organic light emitting display panel 50 includes the first substrate 51 for receiving an organic light emitting element 56, the second substrate 52, a driving circuit 54, and the flexible printed circuit board (FPCB) 53.

The first substrate 51 is formed with an insulating substrate made of glass, quartz, ceramic, or plastic. However, the first exemplary embodiment is not restricted thereto, and the first substrate 51 can be formed as a metallic substrate made of stainless steel.

The second substrate 52 faces the first substrate 51, and covers the driving circuit 54 and the organic light emitting element 56. The second substrate 52 is adhered and sealed, by seals 57, to the first substrate 51 to protect the driving circuit 54 and the organic light emitting element 56.

The driving circuit 54 is formed on the first substrate 51. The driving circuit 54 includes a switching and driving thin film transistor, and drives the organic light emitting element 56.

The organic light emitting element 56 includes an anode, an organic emission layer provided on the anode, and a cathode provided on the organic emission layer. The organic light emitting element 56 displays the image in the upper direction that is the direction of the second substrate 52 by emitting light according to the driving signal provided by the driving circuit 54.

FIG. 6A to FIG. 6G are cross-sectional views of a method for manufacturing a touch screen panel according to a first exemplary embodiment, and for convenience, with reference to the cross-sections as shown in FIG. 4.

Referring to FIG. 6A to FIG. 6G, the manufacturing method of the touch screen panel 10 of an organic light emitting diode (OLED) display 100 includes: preparing a touch substrate 15 (S101); forming an electrode layer 20 on the touch substrate 15 (S102); forming electrode patterns 11 and 12, a wire 9 and access point 16 at crossing point 18 by etching the electrode layer 20 (S103); forming an insulation layer 30 on the etched electrode layer 20 (S104); forming a contact hole 7 and a partial insulation layer 4 by etching the insulation layer 30 (S105); forming a connection layer 40 on the etched insulation layer 30 (S106); and forming a connection electrode 5 for electrically connecting the electrode patterns 11 and 12 by etching the connection layer (S107).

Figure 6A:
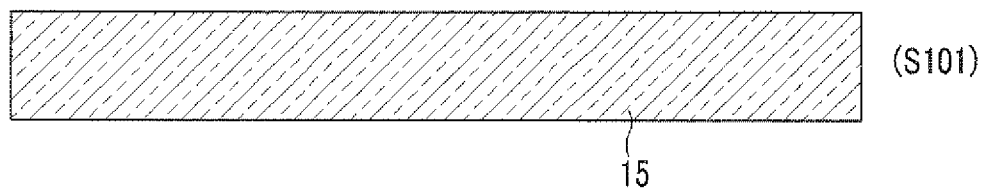
FIG. 6A to FIG. 6G are cross-sectional views of a method for manufacturing an organic light emitting diode (OLED) display according to the first exemplary embodiment.

As shown in FIG. 6A, the touch substrate 15 is prepared (S101). The touch substrate 15 is made of a substrate with optical transmittance, and can be formed with an insulating substrate of glass, quartz, ceramic, or plastic.

Figure 6B:
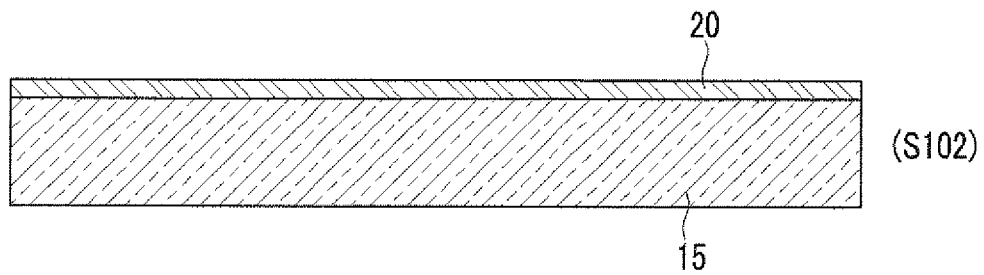

As shown in FIG. 6B, the electrode layer 20 is formed on the touch substrate 15 (S102). The electrode layer 20 is formed by a sputtering method, and can be made of silver (Ag). The electrode layer 20 is formed with a thickness of 10 Å to 1000 Å, and is formed to have optical transmittance.

Figure 6C:
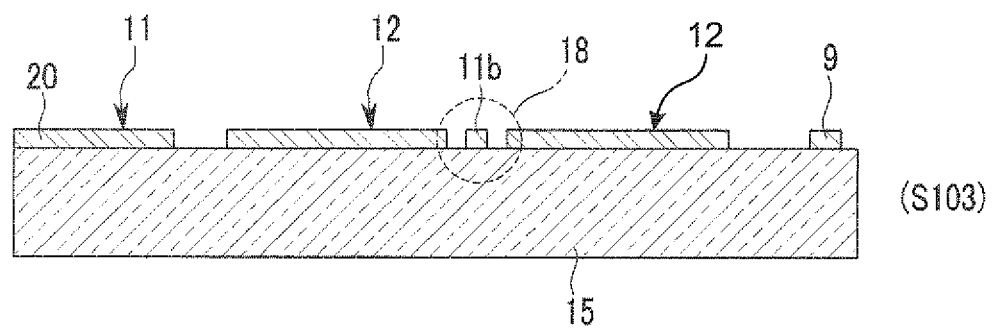

As shown in FIG. 6C, the electrode patterns 11 and 12, the wire 9 and the access unit 11b at the crossing point 18 are formed by etching the electrode layer 20 (S103). By etching the electrode layer 20, the first electrode pattern 11, the second electrode patterns 12, the access unit 11b and a plurality of wires 9 electrically connected to the first electrode pattern 11 and the second electrode patterns 12 are formed. FIG. 6C shows the wire 9 for the first electrode pattern 11, and the wire 9' for the second electrode patterns 12 is also substantially formed. Accordingly, the first electrode pattern 11, the second electrode patterns 12, the access unit 11b, and the wire 9 can be formed with the same material on the same plane.

In this instance, the pads 11a (FIG. 3) of the first electrode pattern 11 are connected in the first direction through the access unit 11b at the crossing point 18 of FIG. 3, and the pads 12a (FIG. 3) of the second electrode patterns 12 are separated in the second direction at the crossing point 18.

Figure 6D:
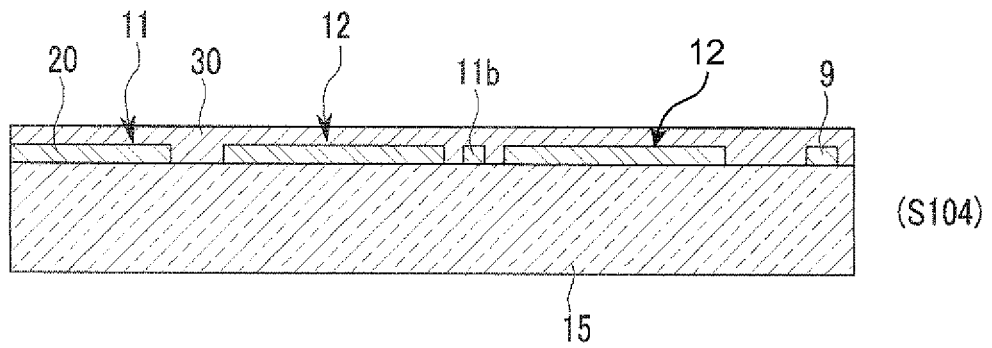

As shown in FIG. 6D, the insulation layer 30 is formed to cover the etched electrode layer 20 and exposed touch substrate 15 (S104). The insulation layer 30 is formed by deposition, and can be made of $SiO_2$ or SiNx. The insulation layer 30 prevents the first electrode pattern 11 and the second electrode patterns 12 from being electrically connected to each other.

Figure 6E:
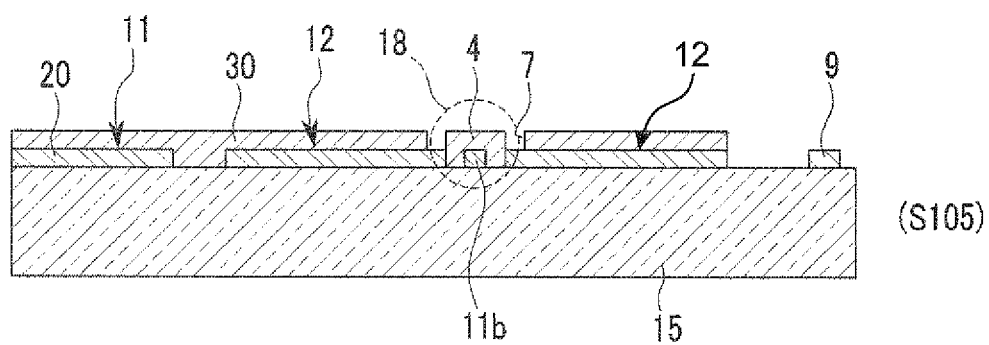

As shown in FIG. 6E, the partial insulation layer 4 and the contact hole 7 are formed by etching the insulation layer 30. Etching to form the contact hole 7 exposes a part of the second electrode patterns 12 at the crossing point 18 to thereby form the partial insulation layer 4 for covering the access unit 11b and insulating the access unit 11b from the second electrode patterns 12 (FIG. 3). Here, the maximum thickness of the partial insulation layer 4 can be substantially equivalent to the maximum thickness of the insulation layer 30.

Figure 6F:
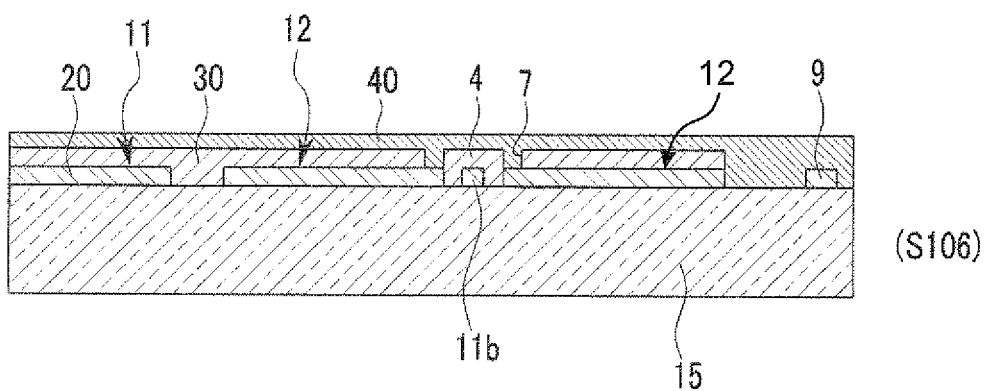

As shown in FIG. 6F, the connection layer 40 is formed on the etched insulation layer 30 and the partial insulation layer 4. In this instance, the connection layer 40 fills the contact hole 7. The connection layer 40 can be made of molybdenum (Mo), titanium (Ti), aluminum (Al), copper (Cu), indium tin oxide (ITO), or silver (Ag) having electrical conductivity. Further, the connection layer 40 can be configured with a dual layer structure of silver (Ag) and ITO, or a multi-layer structure in which layers of silver (Ag) are disposed among a plurality of ITO layers.

Figure 6G:
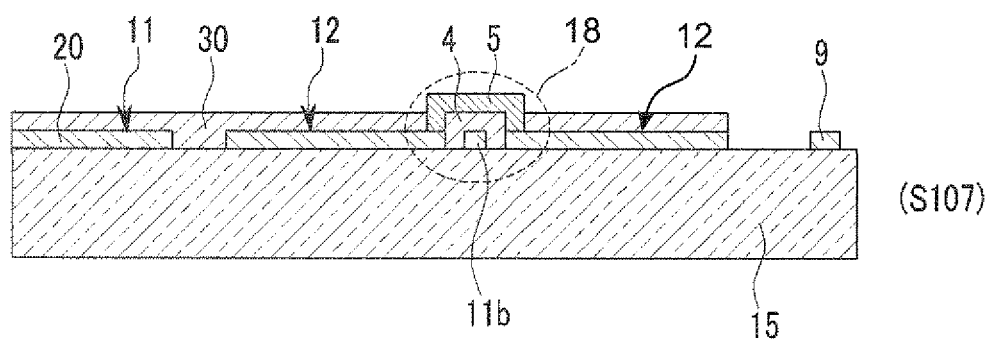

As shown in FIG. 6G, the connection electrode 5 for electrically connecting the neighboring second electrode patterns 12 is formed by etching the connection layer 40. Accordingly, both ends of the connection electrode 5 are inserted into the contact hole 7, maintaining coverage of the partial insulation layer 4, and electrically connecting the second electrode patterns 12 that are separated in the second direction (i.e., y-axis direction) at a crossing point 18.

The above-formed touch screen panel is attached to the organic light emitting display panel through a subsequent process to thereby form an organic light emitting diode (OLED) display having a touch screen function.

As described above, the electrode patterns 11 and 12 and the wires 9 and 9' are formed by the same process, and the electrode patterns 11 and 12 are formed with a material having low resistance in a like manner of the wires 9 and 9'. Accordingly, since sheet resistance of the electrode patterns 11 and 12 is reduced, power consumption is reduced and touch performance is improved.

Furthermore, productivity is improved since a touch screen panel having an electrode pattern covered with an insulation layer can be formed with 3 etching processes. When the electrode pattern is not covered with an insulation layer, the electrode pattern may be scratched, and when the same is covered with the insulation layer according to the exemplary embodiment, the problem of scratching the electrode pattern can be prevented.

Figure 7:
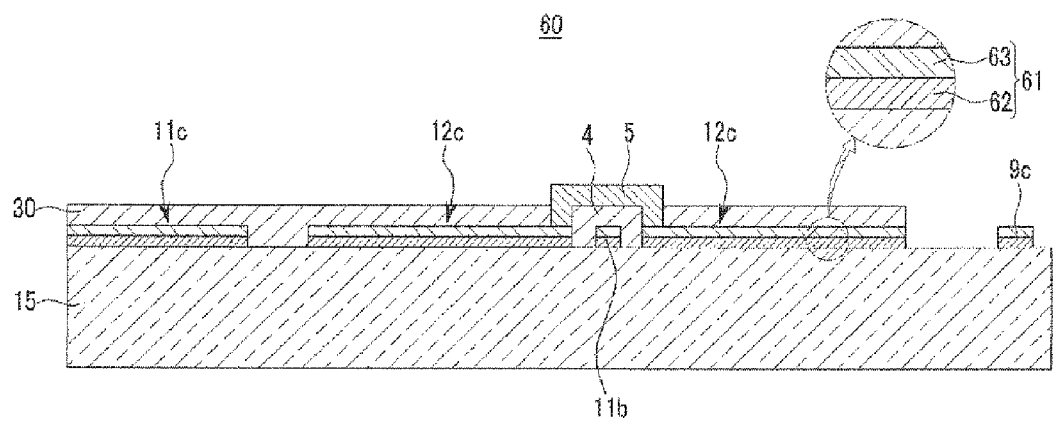
FIG. 7 is a cross-sectional view of an organic light emitting diode (OLED) display according to a second exemplary embodiment.

FIG. 7 is a cross-sectional view of an organic light emitting diode (OLED) display according to a second exemplary embodiment.

Referring to FIG. 7, the touch screen panel 60 according to the second exemplary embodiment has equivalent configurations to the touch screen panel according to the first exemplary embodiment except the configuration of an electrode layer 61, and the equivalent configurations will not be repeatedly described and the equivalent configurations will have the same reference numerals for convenience.

The electrode layer 61, for forming electrode patterns 11c and 12c and the wires 9c, according to the second exemplary embodiment includes a transparent oxide layer 62 and a metallic layer 63. In this instance, the transparent oxide layer 62 can be made of indium tin oxide (ITO), and the metallic layer 63 can be made of silver (Ag). In addition, they can be formed with other materials, and for example, the transparent oxide layer 62 can be made of various kinds of transparent oxides including indium zinc oxide (IZO), aluminum zinc oxide (AZO), and gallium zinc oxide (GZO).

As shown in FIG. 7, the touch screen panel 60 includes a touch substrate 15, a transparent oxide layer 62 formed on the touch substrate 15, and a metallic layer 63 formed on the transparent oxide layer 62. Once etched, for forming electrode patterns 11c and 12c and the wires 9c, the transparent oxide layer 62 and the metallic layer 63, being made of conductive materials, are covered by the insulation layer 30.

When the electrode layer 61 is configured with the transparent oxide layer 62 and the metallic layer 63, the touch screen panel 60 can acquire merits of a transmittance characteristic because of the transparent oxide layer 62 and a sheet resistance characteristic because of the metallic layer 63.

Figure 8:
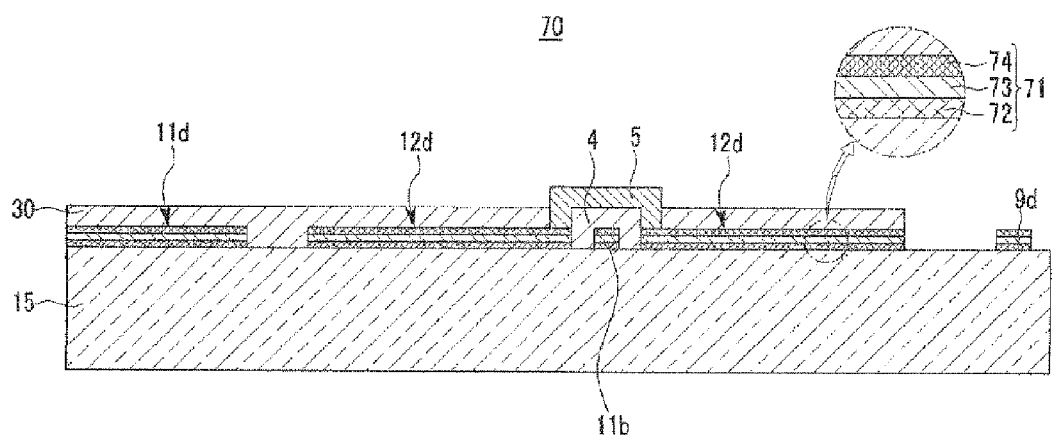
FIG. 8 is a cross-sectional view of an organic light emitting diode (OLED) display according to a third exemplary embodiment.

FIG. 8 is a partial cross-sectional view of a touch screen panel according to a third exemplary embodiment.

Referring to FIG. 8, the touch screen panel 70 has equivalent configurations to the touch screen panel according to the first exemplary embodiment except the configuration of an electrode layer 71, and the equivalent configurations will not be repeatedly described and the equivalent configurations will have the same reference numerals for convenience.

The electrode layer 71, for forming electrode patterns 11d and 12d and the wires 9d, includes a first transparent oxide layer 72, a second transparent oxide layer 74 arranged to face the first transparent oxide layer 72, and a metallic layer 73 disposed between the first transparent oxide layer 72 and the second transparent oxide layer 74. In this instance, the first transparent oxide layer 72, the second transparent oxide layer 74, and the metallic layer 73 have conductivity.

The first transparent oxide layer 72 and the second transparent oxide layer 74 are made of ITO, and the metallic layer 73 is made of silver (Ag). In a like manner of the second exemplary embodiment, the transparent oxide layers 72 and 74 can be formed with various kinds of transparent oxides including IZO, AZO, and GZO. The metallic layer 73 is formed to have a thickness that is less than 1000 Å, and the transparent oxide layers 72 and 74 are formed to have a thickness that is less than 2000 Å.

The ITO that is a transparent oxide has excellent optical transmittance but has high resistance, and the silver Ag has low resistance but its optical transmittance is deteriorated as its thickness increases. To solve this problem, a metallic layer is disposed between a plurality of transparent oxide layers to control the current to flow with less resistance and have excellent optical transmittance by minimizing the thickness with reference to the metallic layer in the third exemplary embodiment.

According to the third exemplary embodiment, in the comparative example in which the electrode layer for forming the electrode pattern is made of ITO, one electrode pad for the electrode pattern shows sheet resistance of 80 Ω/square (ohms per square) and the electrode pattern shows resistance of 7-8 kΩ; in the case of the first exemplary embodiment (thickness of the first transparent oxide layer and the second transparent oxide layer is 70 Å and thickness of the metallic layer is 150 Å), sheet resistance of the electrode pad is 4.6 Ω/square and resistance of the electrode pattern is 1 kΩ; and in the case of the second exemplary embodiment (thickness of the first transparent oxide layer, the second transparent oxide, and the metallic layer is 70 Å), sheet resistance of the electrode pad is 15 Ω/square and resistance of the electrode pattern is 1 kΩ.

When the metallic layer 73 is formed between the transparent oxide layers 72 and 74, resistance is substantially reduced and appropriate optical transmittance is maintained compared to the prior art.

It has been described in the above-described exemplary embodiments that when the first and second electrode patterns are formed, the pads of the first electrode pattern are formed to be connected by the access unit at their crossing points, and the pads of the second electrode pattern are separated and are connected by the connection electrode.

However, the embodiment can also be configured such that the pads of the first electrode pattern are electrically connected by the connection electrode at the crossing point, and the pads of the second electrode pattern are connected by the access unit.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a touch panel of an organic light emitting diode display device including an organic light emitting display panel, the touch panel being attached to the organic light emitting display panel, the method comprising:
   forming an electrode layer on a touch substrate of the touch panel;
   forming an electrode pattern having plurality pads, an access unit and a wire by etching the electrode layer, the plurality of pads, the access unit and the wire being simultaneously formed in a same plane on the touch substrate;
   forming an insulation layer on the electrode pattern and exposed touch substrate;
   forming a contact hole by etching the insulation layer to expose portions of the electrode pattern;
   forming a metallic layer on the insulation layer while filling the contact hole; and
   forming a connection electrode for electrically connecting adjacent ones of the pads in one direction by etching the metallic layer.

2. The method of claim 1, the etching of the electrode layer comprising:
   forming a first electrode pattern having it plurality of the pads connected in a first direction and a second electrode pattern having a plurality of the pads connected in a second direction crossing the first direction at as crossing point; and
   forming the access unit at the crossing point by separating the pads of the second electrode pattern from each other.

3. The method of claim 2, the forming of the contact hole including exposing ends of the separately disposed pads of the second electrode pattern through the contact hole.

4. The method of claim 2, wherein the electrode layer includes silver (Ag).

5. The method of claim 1, wherein the electrode layer includes silver (Ag).

6. The method of claim 1, wherein the electrode layer includes a transparent oxide layer and a metallic layer.

7. The method of claim 1, wherein the electrode layer is configured with a structure in which a first indium tin oxide (ITO) layer, a silver (Ag) layer, and a second indium tin oxide (ITO) layer are sequentially disposed.

8. The method of claim 1, wherein the etching of the electrode layer comprises:
   forming a first electrode pattern having a plurality of the pads, formed on the touch substrate, and connected in a first direction;
   forming a second electrode pattern having a plurality of pads, and connected in a second direction crossing the first direction; and
   forming the wire, the wire being electrically connected to one of the first electrode pattern and the second electrode pattern.

* * * * *